(12) United States Patent
Gutermuth

(10) Patent No.: US 9,485,852 B2
(45) Date of Patent: Nov. 1, 2016

(54) ARRANGEMENT FOR COOLING SUBASSEMBLIES OF AN AUTOMATION OR CONTROL SYSTEM

(71) Applicant: ABB AG, Mannheim (DE)

(72) Inventor: Stefan Gutermuth, Lorsch (DE)

(73) Assignee: ABB AG, Mannheim (DE)

( * ) Notice: Subject to any disclaimer, the term of this patent is extended or adjusted under 35 U.S.C. 154(b) by 199 days.

(21) Appl. No.: 14/143,465

(22) Filed: Dec. 30, 2013

(65) Prior Publication Data

US 2014/0111946 A1    Apr. 24, 2014

Related U.S. Application Data

(63) Continuation of application No. PCT/EP2012/002825, filed on Jul. 5, 2012.

(30) Foreign Application Priority Data

Jul. 6, 2011    (DE) .................. 10 2011 107 316

(51) Int. Cl.
*H05K 1/02* (2006.01)

(52) U.S. Cl.
CPC ............ *H05K 1/021* (2013.01); *H05K 1/0201* (2013.01); *H05K 1/0203* (2013.01); *H05K 2201/062* (2013.01); *H05K 2201/09063* (2013.01); *H05K 2201/09972* (2013.01)

(58) Field of Classification Search
CPC ............... H05K 7/20; H05K 7/20009; H05K 7/20854; H05K 7/20863; H05K 7/20918; H05K 2201/066; H05K 2201/10416; H05K 2201/10969; H05K 21/4871; H05K 21/4882
USPC ................ 361/688–690, 697, 716, 717–721
See application file for complete search history.

(56) References Cited

U.S. PATENT DOCUMENTS

| | | | |
|---|---|---|---|
| 5,548,481 A * | 8/1996 | Salisbury ........... | H05K 7/20854 174/16.3 |
| 5,793,611 A * | 8/1998 | Nakazato ............ | H05K 1/0201 165/104.33 |

(Continued)

FOREIGN PATENT DOCUMENTS

| | | |
|---|---|---|
| DE | 695 00 046 T2 | 1/1997 |
| DE | 101 62 404 A1 | 7/2003 |

(Continued)

OTHER PUBLICATIONS

Search Report mailed on Apr. 12, 2013, by the German Patent Office for Application No. 10 2011 107 316.0.

*Primary Examiner* — Adam B Dravininkas
(74) *Attorney, Agent, or Firm* — Taft Stettinius & Hollister LLP

(57) ABSTRACT

An arrangement for cooling subassemblies of an automation or control system is disclosed, wherein the subassemblies each comprise at least one printed circuit board (LP) having electronic components of different temperature sensitivity arranged thereon. The printed circuit board (LP) has at least one first portion for temperature-sensitive components and at least one second portion for temperature-insensitive components that generate waste heat. Interspaces are arranged between the first portion and the second portion, the interspaces each forming a thermally insulated trench. Means can be provided which keep away the heat over the temperature-sensitive components in a suitable manner and dissipate the waste heat from the printed circuit board (LP) before the heat reaches the temperature-sensitive components.

20 Claims, 3 Drawing Sheets

(56) References Cited

U.S. PATENT DOCUMENTS

| | | | | |
|---|---|---|---|---|
| 6,239,972 | B1* | 5/2001 | Tehan | H05K 7/1404 165/185 |
| 7,254,033 | B2* | 8/2007 | Jafari | H01L 23/42 165/185 |
| 7,304,842 | B2* | 12/2007 | Yatskov | G06F 1/20 165/80.3 |
| 7,518,862 | B1* | 4/2009 | Macika | G06F 1/20 361/688 |
| 7,532,480 | B1* | 5/2009 | Mimberg | H01L 23/49833 257/706 |
| 7,755,895 | B2* | 7/2010 | Ikeda | H01L 23/36 165/185 |
| 7,768,785 | B2* | 8/2010 | Ni | H01L 23/367 257/707 |
| 2001/0017764 | A1* | 8/2001 | Nakamura | G06F 1/203 361/697 |
| 2003/0128522 | A1 | 7/2003 | Takeda et al. | |
| 2004/0264144 | A1* | 12/2004 | Rogers | G03B 21/16 361/719 |
| 2005/0151240 | A1 | 7/2005 | Takeda et al. | |
| 2005/0207115 | A1* | 9/2005 | Barsun | G06F 1/20 361/690 |
| 2005/0259397 | A1* | 11/2005 | Bash | G06F 1/20 361/699 |
| 2006/0049515 | A1 | 3/2006 | Poechmueller | |
| 2006/0268527 | A1 | 11/2006 | Tanaka et al. | |
| 2008/0084664 | A1* | 4/2008 | Campbell | G06F 1/20 361/699 |
| 2009/0080162 | A1* | 3/2009 | Lin | H05K 1/0204 361/720 |
| 2009/0256161 | A1 | 10/2009 | Sekimoto et al. | |
| 2010/0188821 | A1* | 7/2010 | Yamazaki | H01L 25/0652 361/720 |
| 2010/0328878 | A1* | 12/2010 | Fujiwara | G06F 1/203 361/679.47 |

FOREIGN PATENT DOCUMENTS

| | | |
|---|---|---|
| DE | 10 2004 041 027 A1 | 3/2006 |
| DE | 11 2008 003 664 T5 | 12/2010 |
| DE | 10 2009 060 123 A1 | 6/2011 |
| EP | 1 722 612 A1 | 11/2006 |
| EP | 2 058 861 A1 | 5/2009 |
| EP | 2 187 279 A1 | 5/2010 |
| JP | 2005-223078 A | 8/2005 |
| JP | 2006-339545 A | 12/2006 |

* cited by examiner

ARRANGEMENT FOR COOLING SUBASSEMBLIES OF AN AUTOMATION OR CONTROL SYSTEM

RELATED APPLICATION(S)

This application claims priority as a continuation application under 35 U.S.C. §120 to PCT/EP2012/002825, which was filed as an International Application on Jul. 5, 2012, designating the U.S., and which claims priority to German Application No. 10 2011 107 316.0 filed on Jul. 6, 2011. The entire content of these applications are hereby incorporated by reference in their entireties.

FIELD

The disclosure relates to an arrangement for cooling subassemblies of an automation or control system, which can be used for controlling and/or monitoring outdoor installations, such as a wind power plant.

BACKGROUND INFORMATION

Automation systems for controlling an industrial process can include a multiplicity of subassemblies or devices, for example, which can include a central control unit, also called a central unit, communications modules and input/output units.

The subassemblies of an automation system as described in EP 2187279 A1, for example, can be constructed from printed circuit boards, on which there are arranged various electronic components, such as processors, memory modules and further active and passive electronic components.

The operation of the subassemblies can lead to heating of the subassembly or of the components arranged thereon as a result of the power loss of the components arranged thereon through which current flows.

For example, during their operation, processors can develop waste heat, which can destroy adjacent temperature-sensitive components such as memory modules.

Electric components for industrial devices can have an operating temperature range, which can be cooled, for example, by cooling devices. For example, these cooling devices can be fans in the housing of the device, which can generate an air flow that flows around and through the electric components and subassemblies to help dissipate the power loss and generated heat.

For control systems which can be used under different climatic conditions, these measures may not be sufficient to provide a useful service life of the device, or prevent the operation of components in undesirable environmental temperature ranges. In addition, for example, the mounting of fans cannot always be achieved in a suitable manner to cool the device. In order to operate control systems, for example, in certain environmental conditions, the standard components used in the subassemblies employed, only can satisfy the industrial standard, for example, for a temperature up to about 60° C., and can be replaced by components, which can be costly but can withstand the environmental conditions, for example, temperatures of about 70° C.

SUMMARY

An arrangement for cooling subassemblies of an automation or control system is disclosed, the subassemblies each having at least one printed circuit board (LP) with electronic components of different temperature sensitivity arranged thereon, the arrangement comprising: at least one printed circuit board (LP) having at least one first sub-area for temperature-sensitive components and at least one second sub-area for temperature-insensitive components that give off waste heat; interspaces arranged between the first sub-area and the second sub-area, which form a thermally insulating trench; a means to keep waste heat from the temperature sensitive components; and a means to dissipate the waste heat from the printed circuit board (LP) before the waste heat reaches the temperature-sensitive components.

An arrangement for cooling subassemblies of an automation or control system is disclosed, the subassemblies each having at least one printed circuit board (LP) with electronic components of different temperature sensitivity arranged thereon, the arrangement comprising: at least one printed circuit board (LP) having at least one first sub-area for temperature-sensitive components and at least one second sub-area for temperature-insensitive components that give off waste heat; interspaces arranged between the first sub-area and the second sub-area, which form a thermally insulating trench; at least one first heat sink having a cooling surface arranged over the temperature-sensitive components; and at least one second heat sink having a cooling surface arranged over the temperature-insensitive components that generate waste heat.

BRIEF DESCRIPTION OF THE DRAWINGS

The disclosure is explained below with reference to the exemplary embodiments, shown in the drawing. In the drawing.

DETAILED DESCRIPTION

In accordance with an exemplary embodiment, an arrangement for cooling subassemblies of an automation or control system is disclosed, for example, one suitable for outdoor use, which can take into account the different amounts of waste heat from the various types of electronic components arranged on a printed circuit board and can protect temperature-sensitive components against the waste heat from other components, in order to avoid failure or destruction of the subassemblies, for example, under various climatic conditions. The arrangement according to the disclosure for cooling subassemblies can use standard components in the subassemblies of an automation or control system operating under climatic conditions and can avoid the use of costly temperature-insensitive components.

In accordance with an exemplary embodiment, an arrangement for cooling subassemblies of an automation or control system is disclosed, which can be suitable for subassemblies which can be used for control and/or monitoring in outdoor installations. The subassemblies can include, for example, central units, communications modules and couplers, bus modules and input/output units, which can be built using standard components, such as CPU, RAM and flash memory.

In accordance with an exemplary embodiment, an arrangement according to the disclosure for cooling subassemblies of an automation or control system can be provided for subassemblies of an automation or control system suitable, for example, for use outdoors. The subassemblies can be built from at least one printed circuit board with electronic components of different temperature sensitivity and waste heat emission arranged thereon, the printed circuit board having at least one first sub-area for temperature-sensitive components and at least one second sub-area for temperature-insensitive components that gives off waste heat.

In accordance with an exemplary embodiment, the means listed below can be provided which can keep the heat generated from the power loss of the components through which current flows away from the temperature-sensitive components arranged on the printed circuit board.

In accordance with an exemplary embodiment, a first means can relate to the formation or arrangement of interspaces between the first sub-area and the second sub-area, the interspaces each forming a thermally insulating trench. For example, the means can be formed as heat barriers arranged between the first and the second sub-area, which form thermal insulation between the sub-areas.

In accordance with an exemplary embodiment, separating trenches can be formed, for example, on the printed circuit board, for example by "incising" the surface, by which means thermal separation can be achieved as a result of the severing of the copper.

Figure 2:
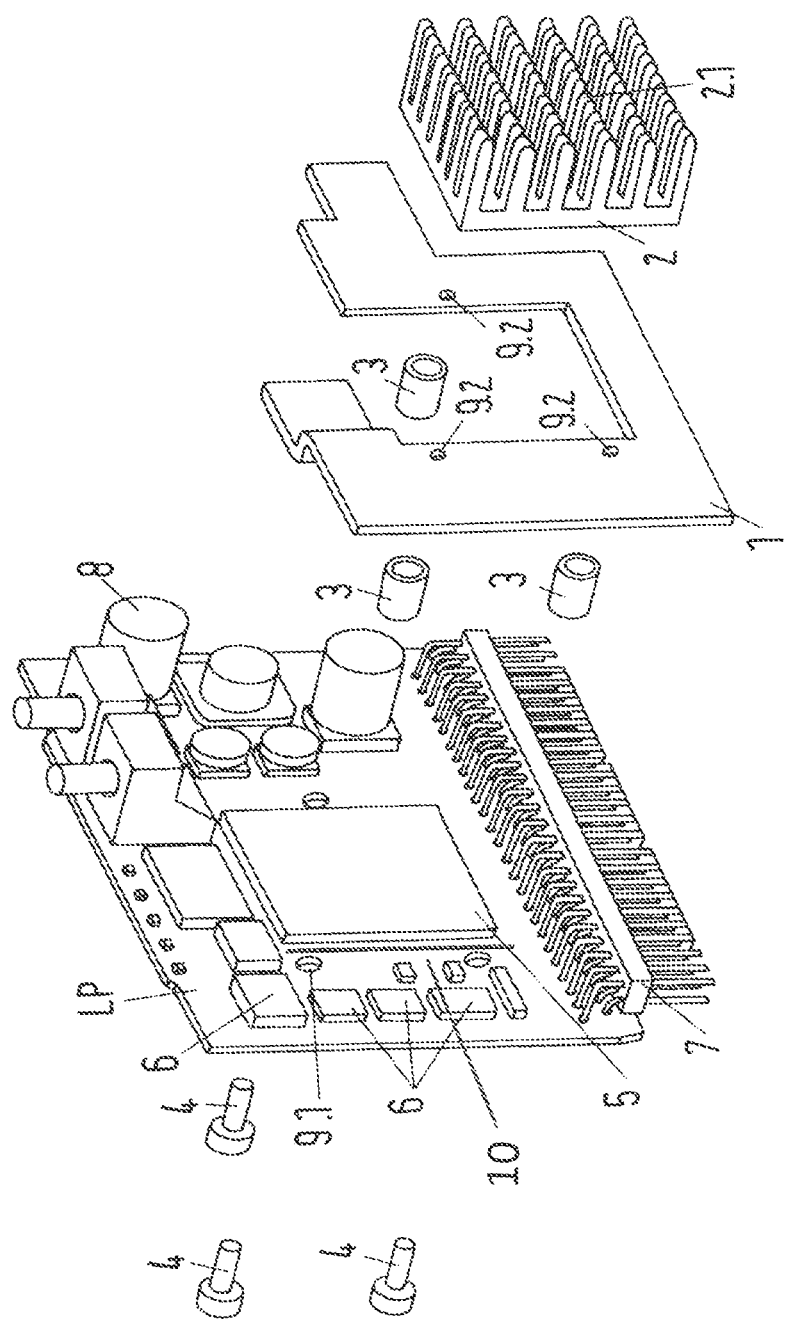
FIG. 2 shows an exemplary embodiment of an outdoor-suitable communications module having the cooling device according to the disclosure.

In accordance with an exemplary embodiment, as shown in FIG. 2, the first sub-area can be separated from the second area by means of transverse milling of the printed circuit board material or by means of a specific interruption of the conductor tracks 10, in order in this way to form a thermally decoupled area on the printed circuit board.

Figure 3:
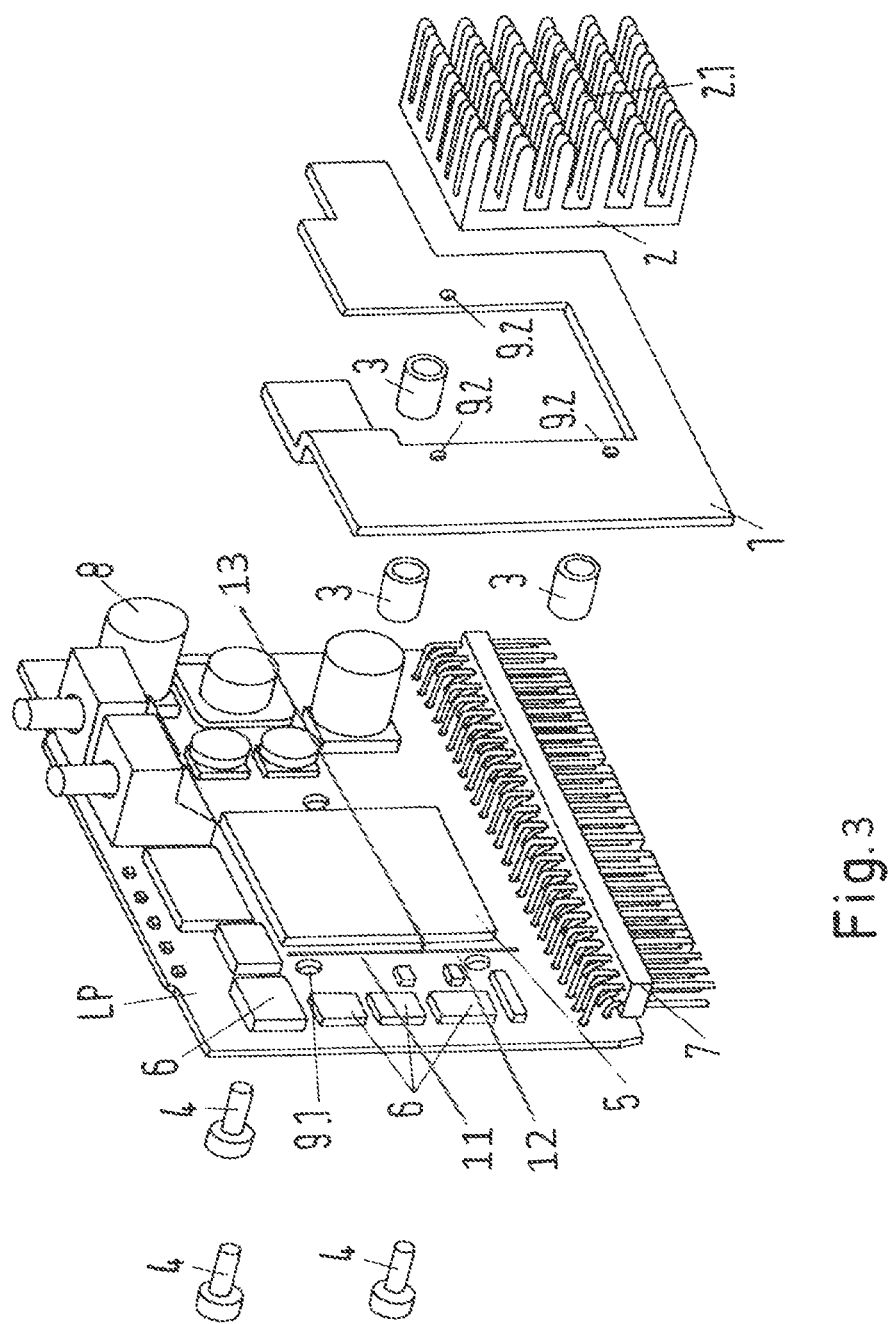
FIG. 3 shows an exemplary embodiment of an outdoor-suitable communications module having the cooling device according to the disclosure.

For example, as shown in FIG. 3, the thermally insulating trenches 11 provided can either be unfilled or filled with a thermally insulating filling material 12 or formed as a depression or well 13.

In accordance with an exemplary embodiment, for cooling subassemblies of the automation or control system, the means can be formed from at least one first heat sink, the cooling elements of which can be arranged directly over the temperature-sensitive components, and from at least one second heat sink, which can be arranged over the temperature-insensitive components that generate waste heat, the heat sinks dissipating the waste heat that accumulates over the respective components in a suitable way.

The cooling surfaces of the heat sinks, implemented as respectively separate parts, can be adapted to the waste heat that accumulates over the respective component such that adequate dissipation of the waste heat via the respective components.

The first heat sink, for example, can be a cooling plate, of which the cooling surface can be located directly over or in the immediate vicinity of the temperature-sensitive components. The cooling plate can be made from aluminum, which can be light and economical as compared with other materials for cooling plates. However, for example, if the subassemblies are used in offshore wind plants, the cooling plate can be made from copper, since copper can exhibit better resistance to salt. The aforementioned measures can also be implemented on the second heat sink.

The second heat sink, for example, can be arranged over a processor and can absorb the waste heat from the latter, the second heat sink have a cooling surface on which elevations, such as cooling ribs, can be arranged.

In an accordance with an exemplary embodiment, the heat sink can be implemented as a so-called cooling block with wells or depressions arranged thereon for the purpose of improved dissipation of the heat given off by the processor.

In accordance with an exemplary embodiment, destruction of the temperature-sensitive components by waste heat from adjacent components can be avoided, since the second heat sink, implemented as a separate part, can avoid a direct connection with the cooling plate covering the temperature-sensitive components.

The first heat sink, which extends over the temperature-sensitive components, can be spaced apart from the printed circuit board LP by means of at least two, for example, a plurality of thermally conductive elements or contacts. The thermally conductive contacts can be formed from connecting elements and spacers pushed on the latter.

The second heat sink can be connected to the printed circuit board by means of a suitable adhesive.

In addition to the different temperature areas which can be formed on the printed circuit board and which can be separated from one another by thermally insulating trenches, the combination of the various heat sinks over the areas of the printed circuit board having differently given off amounts of waste heat, and using the heat-dissipating contacts, which can keep the heat sinks at a defined distance above the printed circuit board and thus can ensure optimal thermal dissipation, dissipation of the waste heat from the printed circuit board can be achieved before the waste heat reaches the temperature-sensitive components. Thus, the arrangement according to the disclosure for cooling subassemblies in an automation or control system operating under outdoor conditions can provide for the build of the subassemblies from standard components, and avoidance of the use of special, costly temperature-insensitive components.

Figure 1:
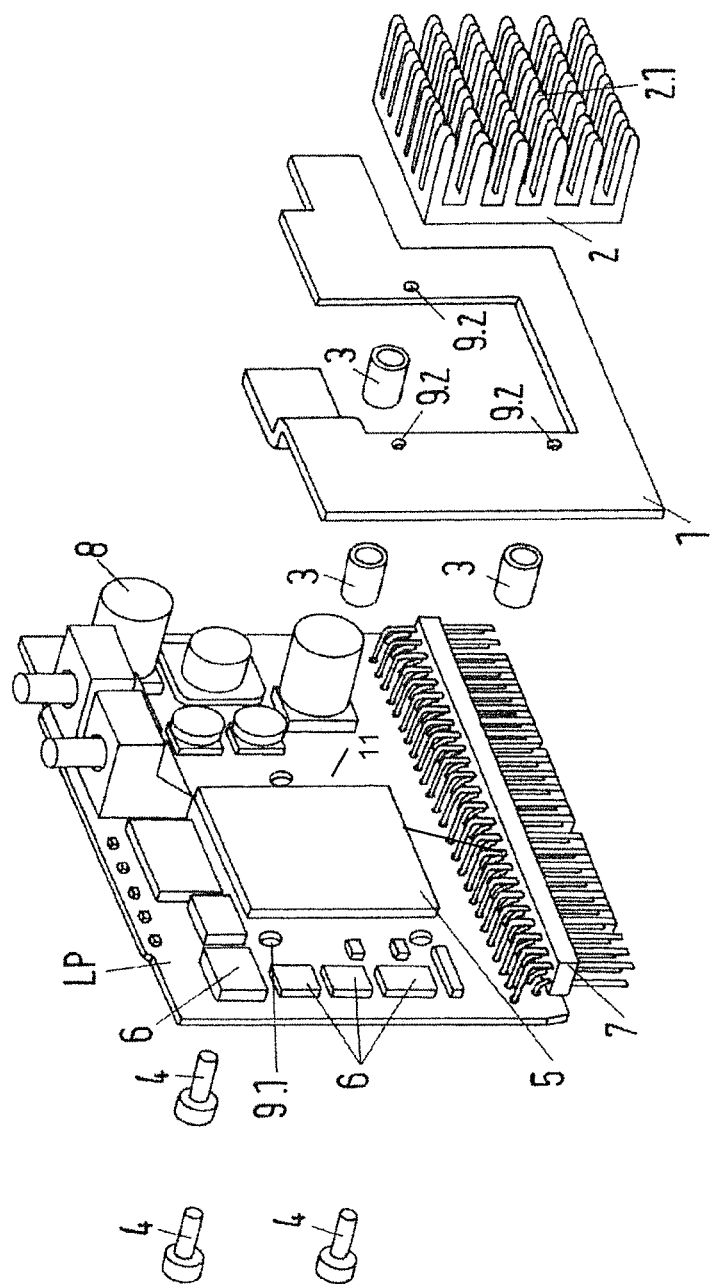
FIG. 1 shows an exemplary embodiment of an outdoor-suitable communications module having the cooling device according to the disclosure, which can permit the use of the communications module, designed from standard components, in outdoor installations up to, for example, a temperature range of about 70° C.

FIG. 1 shows an exemplary embodiment of an outdoor-suitable communications module having the cooling device according to the disclosure, which permits the use of the communications module, designed from standard components, in outdoor installations up to, for example, a temperature range of about 70° C.

In accordance with an exemplary embodiment, the communications module can be built up from a printed circuit board LP, on which the electronic components can use for the function thereof, such as a processor 5, memory elements 6, a plug connector 7 and a power supply 8. For example, when the communications module is put into operation, some components give off waste heat. For example, during its operation, the processor 5 can generate waste heat, which, for example, can destroy the flash memory 6 arranged in close range of the processor 5.

In accordance with an exemplary embodiment, an arrangement can be provided which implements different temperature areas on the printed circuit board LP. For example, in accordance with an exemplary embodiment, subdividing the printed circuit board LP into at least two sub-areas, components which give off a high amount of waste heat (e.g. processors) can be arranged in a first sub-area, and components which give off only little waste heat (for example, flash memories) can be arranged in a second sub-area.

In accordance with an exemplary embodiment, provided between sub-areas which have components of different temperature sensitivity, what are known as thermally insulating trenches 11 can be provided, which extend into the depths of the printed circuit board LP and which can be either unfilled or filled with a thermally insulating filling material, for example, a material of high thermal resistance, in order to separate the components generating waste heat from the thermally sensitive components. In this way, the printed circuit board areas populated with the components that generate waste heat can be decoupled thermally from the printed circuit board areas populated with the components that are thermally sensitive and give off only a little waste heat.

The arrangement for dissipating the waste heat produced during the operation of the communications module further comprises a first heat sink 1, for example, implemented as a cooling plate 1, and a second heat sink 2.

In accordance with an exemplary embodiment, the cooling plate 1 can extend over the temperature-sensitive components 6, 8 and can be held above the printed circuit board LP by means of at least two, for example, a plurality of thermally conductive elements or contacts 3, 4. The thermally conductive contacts 3, 4 can be, for example, formed from screws 4, which are firstly led through openings 9.1 provided in the printed circuit board LP. Spacers 3 can be pushed over the screws 4. The cooling plate 1 can be fitted onto the screws 4 and the spacers 3 can be pushed onto the latter by means of further openings 9.2 provided for the purpose, and can be fixed in a suitable way. In accordance with an exemplary embodiment, the heat can be transferred from the printed circuit board LP directly to the first heat sink 1 via the contacts consisting of thermally conductive metallic material, for example, via metallic spacer sleeves.

The second heat sink 2 can have a cooling surface with elevations 2.1 arranged thereon, for example cooling ribs, by which means the cooling surface of the second heat sink 2 can be enlarged. In accordance with an exemplary embodiment, the heat sink 2 can be implemented as a so-called cooling block with wells or depressions arranged thereon for the purpose of improved dissipation of the heat given off by the processor 5.

In accordance with an exemplary embodiment, as a result of the aforementioned structural configurations of the second heat sink 2, and the implementation of the second heat sink 2 as a separate part, destruction of the temperature-sensitive components 6, 8 by waste heat and a direct connection to the cooling plate 1 covering the temperature-sensitive components 6, 8 can be avoided.

By means of the combination of the variously configured heat sinks 1, 2 over the areas of the printed circuit board LP having differently given off amounts of waste heat, with the heat-dissipating contacts 3, 4, which keep the heat sinks 1, 2 at a defined distance above the printed circuit board LP and thus ensure optimal thermal dissipation, the waste heat is led away from the printed circuit board LP before the heat reaches the temperature-sensitive components 6, 8, and thus keep the heat given off by the processor 5 over the temperature-sensitive components 6, 8 away in a suitable way.

Thus, the printed circuit board areas populated with the components that generate waste heat are decoupled thermally from the printed circuit board areas populated with the thermally sensitive components.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An arrangement for cooling subassemblies of an automation or control system, the subassemblies each having at least one printed circuit board (LP) with electronic components of different temperature sensitivity arranged thereon, the arrangement comprising:
    at least one printed circuit board (LP) having at least one first sub-area for temperature-sensitive components and at least one second sub-area for temperature-insensitive components that give off waste heat, the at least one first sub-area for temperature-sensitive components and the at least one second sub-area for temperature-insensitive component arranged on a first side of the at least one printed circuit board;
    a thermally insulating trench arranged between the first sub-area and the second sub-area;
    at least one first heat sink having a cooling surface arranged directly over the temperature-sensitive components, and which is spaced apart from the at least one printed circuit board on the first side carrying the temperature-sensitive components by at least two thermally conductive elements; and
    at least one second heat sink having a cooling surface on the first side of the printed circuit board and arranged directly over the temperature-insensitive components that generate waste heat, and wherein the cooling surface of the at least one first heat sink is configured differently than the cooling surface of the at least one second heat sink.

2. The arrangement as claimed in claim 1, wherein the thermally insulating trench is formed as a depression or well.

3. The arrangement as claimed in claim 1, wherein the at least one first heat sink is implemented as a cooling plate.

4. The arrangement as claimed in claim 1, wherein the at least one second heat sink has elevations.

5. The arrangement as claimed in claim 4, wherein the elevations are cooling ribs, which are configured to enlarge the cooling surface.

6. The arrangement as claimed in claim 1, wherein the at least one second heat sink is implemented as a cooling block with wells or depressions arranged thereon for dissipation of the heat given off by the temperature-insensitive components.

7. The arrangement as claimed in claim 1, wherein the at least two thermally conductive elements are each formed from metallic spacer sleeves and connecting elements.

8. The arrangement as claimed in claim 7, wherein the at least two thermally conductive elements are screws.

9. The arrangement as claimed in claim 1, wherein the subassemblies are configured for controlling and/or monitoring outdoor installations.

10. The arrangement as claimed in claim 1, wherein the first sub-area is separated from the second sub-area by means of an interruption of a conductor track.

11. The arrangement as claimed in claim 1, comprising:
    a thermally insulating filling material, which fills the thermally insulating trench.

12. The arrangement as claimed in claim 1, wherein the at least one first heat sink is in thermal contact with the at least one printed circuit board.

13. The arrangement as claimed in claim 1, wherein the cooling surface of the cooling surface of the at least one first heat sink and the cooling surface of the at least one second heat sink are arranged as separate parts.

14. The arrangement as claimed in claim 1, wherein the cooling surface of the at least one second heat sink has a greater heat dissipation than the cooling surface of the at least one first heat sink.

15. An arrangement for cooling subassemblies of an automation or control system, the subassemblies each having at least one printed circuit board (LP) with electronic components of different temperature sensitivity arranged thereon, the arrangement comprising:
- at least one printed circuit board (LP) having at least one first sub-area for temperature-sensitive components and at least one second sub-area for temperature-insensitive components that give off waste heat, the at least one first sub-area for temperature-sensitive components and the at least one second sub-area for temperature-insensitive component arranged on a first side of the at least one printed circuit board;
- a thermally insulating trench arranged between the first sub-area and the second sub-area;
- at least one first heat sink having a cooling surface arranged over the temperature-sensitive components, and which is spaced apart from the at least one printed circuit board on the first side carrying the temperature-sensitive components by at least two thermally conductive elements, and wherein the at least one first heat sink is implemented as a cooling plate; and
- at least one second heat sink having a cooling surface on the first side of the printed circuit board and arranged over the temperature-insensitive components that generate waste heat, and wherein the at least one second heat sink has elevations.

16. The arrangement as claimed in claim 15, wherein the elevations are cooling ribs, which are configured to enlarge the cooling surface.

17. The arrangement as claimed in claim 15, wherein the cooling surface of the at least one first heat sink is directly over the temperature-sensitive components, and the cooling surface of the at least one second heat sink is directly over the temperature-insensitive components.

18. The arrangement as claimed in claim 15, wherein the cooling surface of the cooling surface of the at least one first heat sink and the cooling surface of the at least one second heat sink are arranged as separate parts, and the cooling surface of the at least one second heat sink has a greater heat dissipation than the cooling surface of the at least one first heat sink.

19. An arrangement for cooling subassemblies of an automation or control system, the subassemblies each having at least one printed circuit board (LP) with electronic components of different temperature sensitivity arranged thereon, the arrangement comprising:
- at least one printed circuit board (LP) having at least one first sub-area for temperature-sensitive components and at least one second sub-area for temperature-insensitive components that give off waste heat, the at least one first sub-area for temperature-sensitive components and the at least one second sub-area for temperature-insensitive component arranged on a first side of the at least one printed circuit board;
- a thermally insulating trench arranged between the first sub-area and the second sub-area;
- at least one first heat sink having a cooling surface arranged over the temperature-sensitive components, and which is spaced apart from the at least one printed circuit board on the first side carrying the temperature-sensitive components by at least two thermally conductive elements, and wherein the at least one first heat sink is implemented as a cooling plate; and
- at least one second heat sink having a cooling surface on the first side of the printed circuit board and arranged over the temperature-insensitive components that generate waste heat, and wherein the at least one second heat sink is implemented as a cooling block with wells or depressions arranged thereon for dissipation of the heat given off by the temperature-insensitive components.

20. The arrangement as claimed in claim 19, wherein the cooling surface of the at least one first heat sink is directly over the temperature-sensitive components, and the cooling surface of the at least one second heat sink is directly over the temperature-insensitive components.

* * * * *